United States Patent
Chu

(10) Patent No.: US 9,236,148 B2
(45) Date of Patent: Jan. 12, 2016

(54) MEMORY MANAGEMENT METHOD, MEMORY CONTROL CIRCUIT UNIT AND MEMORY STORAGE APPARATUS

(71) Applicant: PHISON ELECTRONICS CORP., Miaoli (TW)

(72) Inventor: Chien-Hua Chu, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 120 days.

(21) Appl. No.: 14/263,979

(22) Filed: Apr. 28, 2014

(65) Prior Publication Data

US 2015/0234692 A1 Aug. 20, 2015

(30) Foreign Application Priority Data

Feb. 14, 2014 (TW) .............. 103104917 A

(51) Int. Cl.
| | |
|---|---|
| G11C 29/00 | (2006.01) |
| G06F 11/07 | (2006.01) |
| G06F 11/20 | (2006.01) |
| G06F 11/10 | (2006.01) |
| G06F 11/16 | (2006.01) |

(52) U.S. Cl.
CPC .............. *G11C 29/70* (2013.01); *G06F 11/076* (2013.01); *G06F 11/1048* (2013.01); *G06F 11/1068* (2013.01); *G06F 11/1666* (2013.01); *G06F 11/20* (2013.01); *G06F 11/2038* (2013.01); *G06F 11/2046* (2013.01)

(58) Field of Classification Search
CPC ...... G11C 29/70; G06F 11/20; G06F 11/1666
See application file for complete search history.

(56) References Cited

U.S. PATENT DOCUMENTS

| | | | | |
|---|---|---|---|---|
| 5,867,641 A * | 2/1999 | Jenett | ................. | G06F 12/0246 711/103 |
| 6,594,183 B1 * | 7/2003 | Lofgren | .............. | G06F 12/0246 365/185.09 |
| 7,949,910 B2 * | 5/2011 | Kanno | ................ | G06F 11/1068 365/201 |
| 8,001,318 B1 * | 8/2011 | Iyer | ..................... | G06F 12/0246 711/103 |
| 8,046,526 B2 * | 10/2011 | Yeh | ....................... | G06F 12/0246 365/185.29 |
| 8,352,674 B2 * | 1/2013 | Suzuki | ............... | G06F 12/0246 711/103 |
| 2002/0041517 A1 * | 4/2002 | Kim | .................... | G06F 12/0246 365/185.11 |
| 2002/0085416 A1 * | 7/2002 | Yamagami | ........... | G06F 3/0601 365/185.09 |
| 2003/0099134 A1 * | 5/2003 | Lasser | .................... | G11C 16/20 365/185.29 |
| 2004/0083335 A1 * | 4/2004 | Gonzalez | ........... | G06F 12/0246 711/103 |
| 2007/0150689 A1 * | 6/2007 | Pandit | ................... | G06F 3/0616 711/170 |
| 2008/0313505 A1 * | 12/2008 | Lee | ..................... | G06F 12/0246 714/47.2 |
| 2010/0049907 A1 * | 2/2010 | Kitsunai | ............ | G06F 12/0246 711/103 |
| 2012/0023144 A1 * | 1/2012 | Rub | .................... | G06F 12/0246 707/813 |

* cited by examiner

*Primary Examiner* — Joseph D Torres
(74) *Attorney, Agent, or Firm* — Jianq Chyun IP Office

(57) ABSTRACT

A memory management method, a memory control circuit unit using the method, and a memory storage apparatus using the method are provided. The memory management method includes determining whether a use count of the rewritable non-volatile memory module is greater than a use count threshold; based on a result of the determination, sorting each physical erasing unit in a spare area in an ascending manner according to an erasing count of each physical erasing unit in the spare area or according to the number of maximum bit errors of the physical erasing units in the spare area, so as to form a plurality of sorted physical erasing units; and selecting the foremost physical erasing unit from the spare area to write data according to the sorted physical erasing units. By applying the memory management method, the lifespan of the rewritable non-volatile memory module may be effectively prolonged.

21 Claims, 9 Drawing Sheets

MEMORY MANAGEMENT METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103104917, filed on Feb. 14, 2014. The entirety of the above-mentioned patent application is hereby incorporated by reference herein and made a part of this specification.

BACKGROUND

1. Technology Field

The present invention relates to a memory management method; particularly, the invention relates to a memory management method suitable for a rewritable non-volatile memory module, a memory control circuit unit using the method, and a memory storage apparatus using the method.

2. Description of Related Art

Digital cameras, mobile phones, and MP3 players have undergone rapid growth in recent years, so that consumers' demands for storage media have also increased drastically. Since a rewritable non-volatile memory module is characterized by non-volatility of data, the low power consumption, the small volume, the non-mechanical structure, and the fast reading and writing speed, the rewritable non-volatile memory is the most adaptable memory to be applied in a portable electronic product, e.g., a notebook computer. A solid state drive (SSD) is a storage apparatus which utilizes a flash memory as its memory storage medium. Therefore, the flash memory industry has become a very popular part of the electronic industry in recent years.

Wear leveling is one of the techniques adapted for managing a rewritable non-volatile memory module. The number of times of erasing data from and writing data into physical erasing units in the rewritable non-volatile memory module is limited, and the repeated erasing and writing operations on one single block may slow down the speed of data access and may even cause the physical erasing unit to be bad. The wear leveling technique aims at equally employing each physical erasing unit in the rewritable non-volatile memory module, so as to prevent "certain" physical erasing units from aging due to the overloaded use and the excessive use counts. Thereby, the error rate of data stored on these physical erasing units may be raised, the aging process is accelerated, and these physical erasing units may be labeled as defective physical erasing units and can no longer be used once the use counts of these physical erasing units reach the limited use counts guaranteed by manufacturers.

However, it is not necessary for each of the physical erasing units to be damaged after the use counts of these physical erasing units reach the limited use counts guaranteed by the manufacturers. Specifically, given that the use counts of certain physical erasing units reach the limit guaranteed by the manufacturer, some of these physical erasing units may have less number of bit errors, while the other physical erasing units may have more number of bit errors. If the physical erasing units with less number of bit errors can be protected by the error check and correcting (ECC) mechanism, the data errors on these physical erasing units may be corrected by means of the ECC mechanism, and such physical erasing units may still be used.

Conventionally, the number of times of writing or erasing data serves as a benchmark while the wear leveling technique is applied, and whether the use counts of the physical erasing units reach the limit guaranteed by the manufacturer and whether these physical erasing units can be further used are not taken into consideration. As long as the use counts of the physical erasing units reach the limit, these physical erasing unit are labeled as defective physical erasing units and can no longer be used. Thereby, the lifespan of the rewritable non-volatile memory module is shortened.

SUMMARY

The present invention is directed to a memory management method, a memory control circuit unit, and a memory storage apparatus capable of effectively prolong the lifespan of a memory.

In an exemplary embodiment of the present invention, a memory management method for a rewritable non-volatile memory module is provided, and the rewritable non-volatile memory module has a plurality of physical erasing units. The memory management method includes recording an erasing count of each of the physical erasing units, grouping the physical erasing units at least into a spare area and a data area, and determining whether a use count of the rewritable non-volatile memory module is greater than a use count threshold. The memory management method also includes, if the use count of the rewritable non-volatile memory module is not greater than the use count threshold, sorting each of the physical erasing units in the spare area in an ascending manner according to the erasing count of each of the physical erasing units in the spare area, so as to form a plurality of sorted physical erasing units; if the use count of the rewritable non-volatile memory module is greater than the use count threshold, sorting each of the physical erasing units in the spare area in the ascending manner according to the number of maximum bit errors of the physical erasing units in the spare area, so as to form the sorted physical erasing units. The memory management method further includes selecting a first physical erasing unit from the spare area to write data according to the sorted physical erasing units, wherein the first physical erasing unit is a foremost physical erasing unit of the sorted physical erasing units.

In an exemplary embodiment of the present invention, a memory control circuit unit configured to control a rewritable non-volatile memory module is provided. The memory control circuit unit includes a host interface, a memory interface, and a memory management circuit. The host interface is configured to be coupled to a host system. The memory interface is configured to be coupled to the rewritable non-volatile memory module, and the rewritable non-volatile memory module has a plurality of physical erasing units. The memory management circuit is coupled to the host interface and the memory interface and configured to record an erasing count of each of the physical erasing units. Here, the memory management circuit is further configured to group the physical erasing units at least into a spare area and a data area and determine whether a use count of the rewritable non-volatile memory module is greater than a use count threshold. If the use count of the rewritable non-volatile memory module is not greater than the use count threshold, the memory management circuit is further configured to sort each of the physical erasing units in the spare area in an ascending manner according to the erasing count of each of the physical erasing units in the spare area, so as to form a plurality of sorted physical erasing units; if the use count of the rewritable non-volatile memory module is greater than the use count threshold, the memory management circuit is further configured to sort each of the physical erasing units in the spare area in the ascending manner according to the number of maximum bit errors of the physical erasing units in the spare area, so as to form the sorted physical erasing units. The memory management circuit is further configured to issue a command sequence to the rewritable non-volatile memory module, the command sequence is configured to select a first physical erasing unit from the spare area to write data according to the sorted physical erasing units, and the first physical erasing unit is a foremost physical erasing unit of the sorted physical erasing units.

In an exemplary embodiment of the present invention, a memory storage apparatus that includes a connection interface unit, a rewritable non-volatile memory module, and a memory control circuit unit is provided. The connection interface unit is configured to be coupled to a host system. The rewritable non-volatile memory module has a plurality of physical erasing units. The memory control circuit unit is coupled to the connection interface unit and the rewritable non-volatile memory module and configured to record an erasing count of each of the physical erasing units. Besides, the memory control circuit unit is further configured to group the physical erasing units at least into a spare area and a data area and determine whether a use count of the rewritable non-volatile memory module is greater than a use count threshold. If the use count of the rewritable non-volatile memory module is not greater than the use count threshold, the memory control circuit unit is further configured to sort each of the physical erasing units in the spare area in an ascending manner according to the erasing count of each of the physical erasing units in the spare area, so as to form a plurality of sorted physical erasing units. If the use count of the rewritable non-volatile memory module is greater than the use count threshold, the memory control circuit unit is further configured to sort each of the physical erasing units in the spare area in an ascending manner according to the number of maximum bit errors of each of the physical erasing units in the spare area, so as to form a plurality of sorted physical erasing units. The memory control circuit unit is further configured to select a first physical erasing unit from the spare area to write data according to the sorted physical erasing units, and the first physical erasing unit is a foremost physical erasing unit of the sorted physical erasing units.

In light of the foregoing, in the rewritable non-volatile memory module described herein the physical erasing units whose use counts reach the limit guaranteed by the manufacturer can still be used, so as to prolong the lifespan of the rewritable non-volatile memory module.

It should be understood, however, that this Summary may not contain all of the aspects and embodiments of the invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
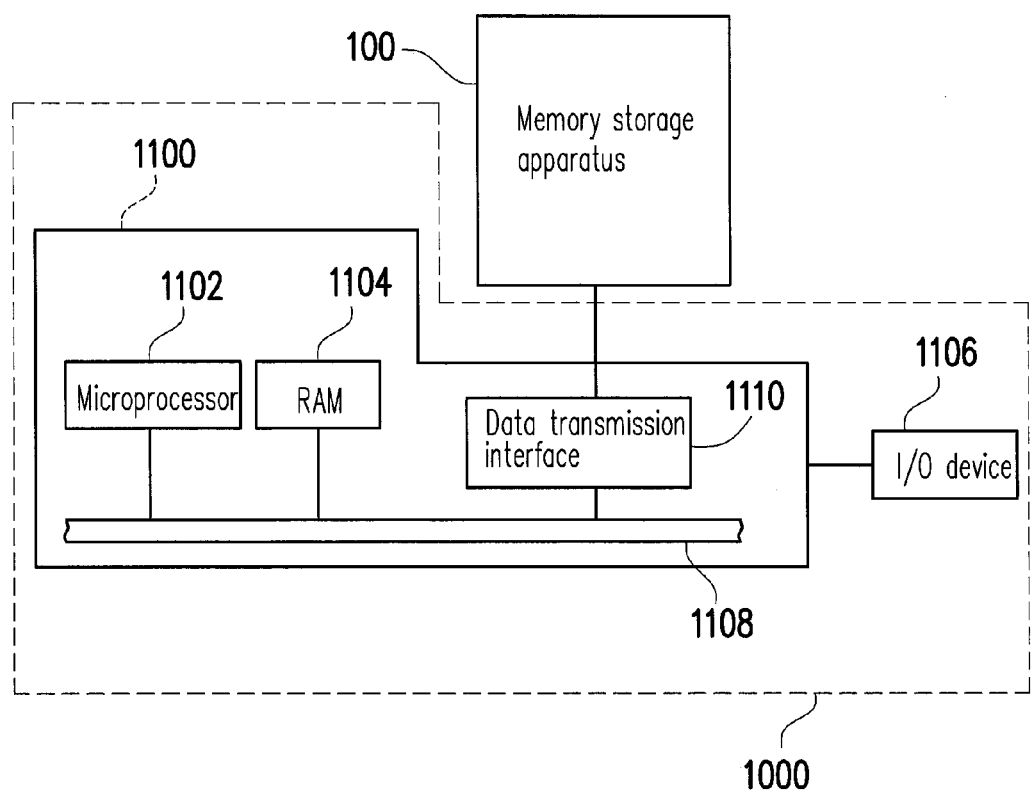
FIG. 1 illustrates a host system and a memory storage apparatus according to an exemplary embodiment of the present invention.

Reference will now be made in detail to the exemplary embodiments of the invention, examples of which are illustrated in the accompanying drawings. Wherever possible, the same reference numbers are used in the drawings and the description to refer to the same or like parts. Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more," and "at least one" can be used interchangeably herein.

FIG. 1 illustrates a host system and a memory storage apparatus according to an exemplary embodiment of the present invention.

Figure 2:
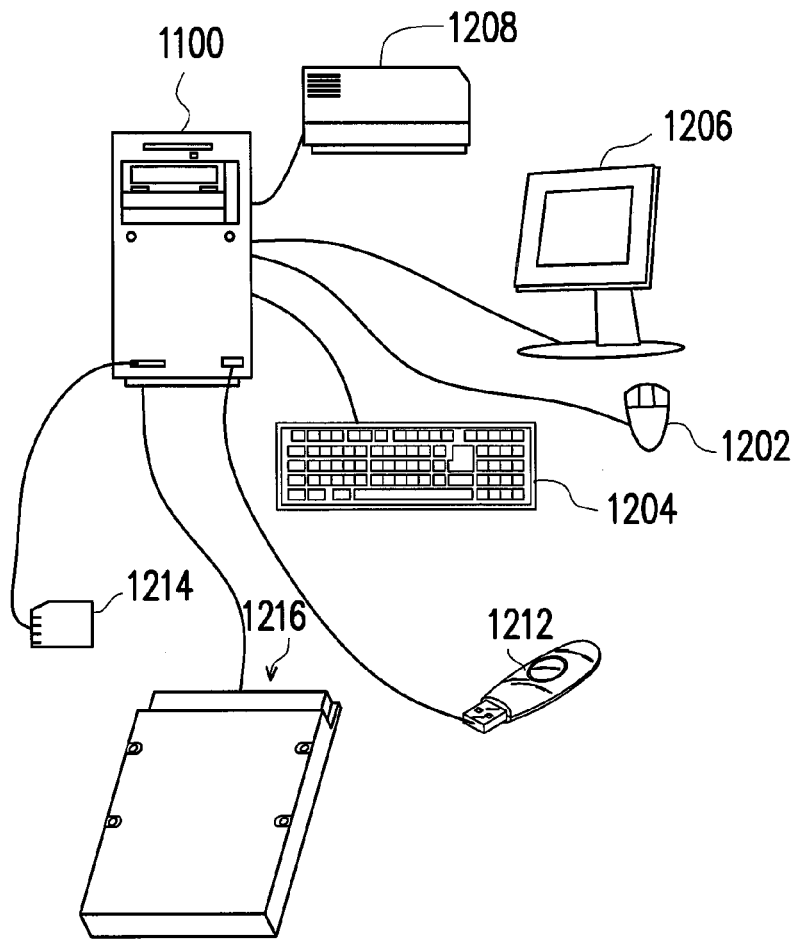
FIG. 2 is a schematic diagram illustrating a computer, an input/output (I/O) device, and a memory storage apparatus according to an exemplary embodiment of the present invention.

With reference to FIG. 1, a host system 1000 normally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 2. It should be understood that the I/O device 1106 is not limited to include the devices shown in FIG. 2 and may further include other devices.

In the exemplary embodiment of the invention, the memory storage apparatus 100 is electrically connected to other devices of the host system 1000 through the data transmission interface 1110. Through operating the microprocessor 1102, the RAM 1104, and the I/O device 1106, the data can be written into or read from the memory storage apparatus 100. For instance, the memory storage apparatus 100 may be a rewritable non-volatile memory module storage apparatus, such as a flash drive 1212, a memory card 1214, or a solid state drive (SSD) 1216 shown in FIG. 2.

Figure 3:
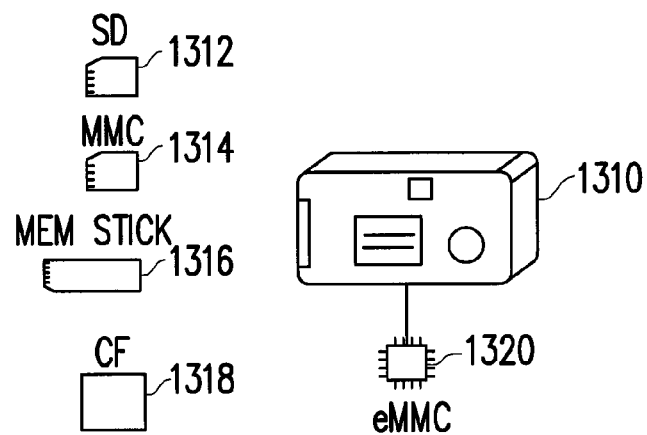
FIG. 3 is a schematic diagram illustrating a host system and a memory storage apparatus according to an exemplary embodiment of the present invention.

Generally, the host system 1000 may be any system that can be substantively operated together with the memory storage apparatus 100 to store data. Even though the host system 1000 is described as a computer system in the present exemplary embodiment, the host system 1000 in other exemplary embodiments may be a digital camera, a video camera, a communication device, an audio player, a video player, and so forth. For instance, if the host system is a digital camera (a video camera) 1310, the rewritable non-volatile memory module storage apparatus is then an SD card 1312, an MMC card 1314, a memory stick 1316, a CF card 1318, or an embedded storage apparatus 1320 (as shown in FIG. 3). The embedded storage apparatus 1320 includes an embedded MMC (eMMC). It should be mentioned that the eMMC is directly electrically connected to the substrate of the host system.

Figure 4:
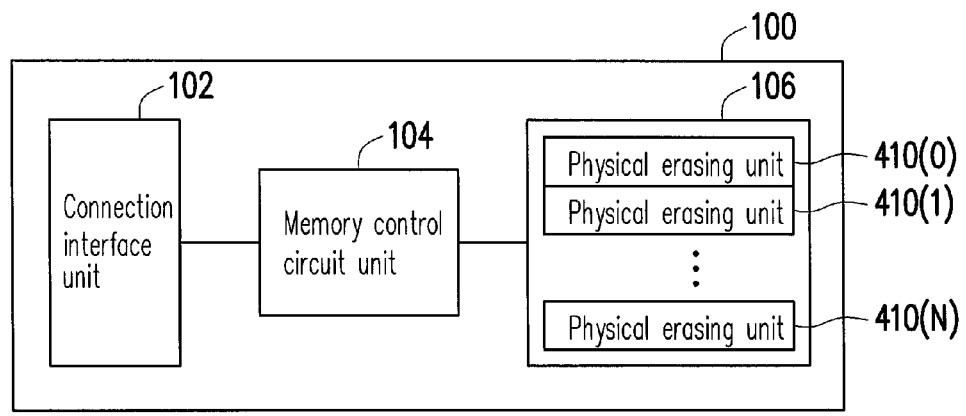
FIG. 4 is a simple block diagram illustrating the memory storage apparatus depicted in FIG. 1.

FIG. 4 is a simple block diagram illustrating the memory storage apparatus depicted in FIG. 1.

With reference to FIG. 4, the memory storage apparatus 100 includes a connection interface unit 102, a memory control circuit unit 104, and a rewritable non-volatile memory module 106.

In the present exemplary embodiment, the connection interface unit 102 complies with the serial advanced technology attachment (SATA) standard. However, it should be understood that the invention is not limited thereto, and the connection interface unit 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the ultra high speed-I (UHS-I) interface standard, the ultra high speed-II (UHS-II) interface standard, the serial advanced technology attachment (SATA) standard, the memory stick (MS) interface standard, the multi media card (MMC) interface standard, the compact flash (CF) standard, the integrated device electronics (IDE) standard, or other suitable standards. According to the present exemplary embodiment, the connection interface unit and the memory control circuit unit may be packaged into one chip, or the connection interface unit may be arranged outside a chip having the memory control circuit unit.

The memory control circuit unit 104 is configured to execute a plurality of logic gates or control instructions implemented in a hardware form or a firmware form and issue a command sequence to perform various data operations (e.g., data writing, reading, and erasing) on the rewritable non-volatile memory module 106 according to commands issued by the host system 1000.

The rewritable non-volatile memory module 106 is electrically connected to the memory control circuit unit 104 and configured for storing data written by the host system 1000. The rewritable non-volatile memory module 106 has a plurality of physical erasing units 410(0) to 410(N). For instance, the physical erasing units 410(0) to 410(N) may belong to the same memory die or belong to different memory dies. Each physical erasing unit has a plurality of physical programming units; for instance, in the present exemplary embodiment, each physical erasing unit includes 258 physical programming units, and data may be independently written into or simultaneously erased from the physical programming units belonging to the same physical erasing unit. However, the invention is not limited thereto, and each of the physical erasing units may also be comprised of 64, 256, or any other number of physical programming units.

More specifically, the physical erasing unit is the smallest unit for erasing data; namely, each of the physical erasing units contains the least number of memory cells that are erased all together. The physical programming unit is the smallest unit for programming data; that is, each of the physical programming units is the smallest unit for writing data. Each physical programming unit usually includes a data bit area and a redundant bit area. The data bit area includes a plurality of physical access addresses for storing data of users, and the redundant bit area is configured for storing system data (e.g., control information and error correcting codes). In the present exemplary embodiment, each data bit area of the physical programming unit contains 4 physical access addresses, and the size of each physical access address is 512 bytes. However, in other exemplary embodiments, more or less number of the physical access addresses may be contained in the data bit area, and the amount and the size of the physical access addresses are not limited in the invention. For instance, in an exemplary embodiment, the physical erasing units are physical blocks, and the physical programming units are physical pages or a physical sectors, which should however not be construed as limitations to the invention.

In the present exemplary embodiment, the rewritable non-volatile memory module 106 is a multi-level cell (MLC) NAND flash memory module (i.e., a flash memory module capable of storing data of 2 bits in one memory cell). However, the invention is not limited thereto, and the rewritable non-volatile memory module 106 may also be a single-level cell (SLC) NAND flash memory module (i.e., a flash memory module capable of storing data of 1 bit in one memory cell), a trinary-level cell (TLC) NAND flash memory module (i.e., a flash memory module capable of storing data of 3 bits in one memory cell), other flash memory modules, or other memory modules having the same characteristics.

Figure 5:
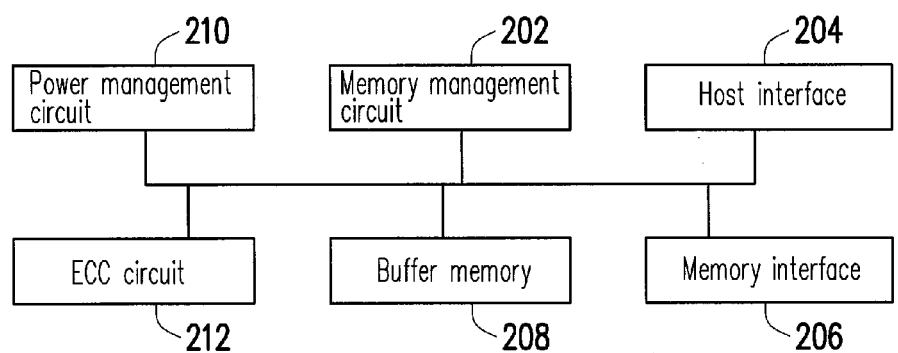
FIG. 5 is a simple block diagram illustrating a memory control circuit unit according to an exemplary embodiment of the present invention.

FIG. 5 is a simple block diagram illustrating a memory control circuit unit according to an exemplary embodiment of the present invention.

With reference to FIG. 5, the memory control circuit unit 104 includes a memory management circuit 202, a host interface 204, and a memory interface 206.

The memory management circuit 202 is configured to control the overall operation of the memory control circuit unit 104. Particularly, the memory management circuit 202 has a plurality of control instructions; when the memory storage apparatus 100 is in operation, the control instructions are executed to perform data writing, reading, and erasing operations.

In the present exemplary embodiment, the control instructions of the memory management circuit 202 are implemented in a firmware form. For instance, the memory management circuit 202 has a microprocessor unit (not shown) and a read-only memory (ROM, not shown), and these control instructions are burnt into the ROM. When the memory storage apparatus 100 is in operation, the control instructions are executed by the microprocessor unit to write, read, and erase data.

In another exemplary embodiment of the invention, the control instructions of the memory management circuit 202 may also be stored in a specific area of the rewritable non-volatile memory module 106 (e.g., a system area of a memory module exclusively used for storing system data) in form of programming codes. Additionally, the memory management circuit 202 has a microprocessor unit (not shown), a ROM (not shown), and a RAM (not shown). In particular, the ROM has boot codes, and when the memory control circuit unit 104 is enabled, the microprocessor unit first executes the boot codes to load the control instructions from the rewritable non-volatile memory module 106 into the RAM of the memory management circuit 202. The microprocessor unit then runs the control instructions to write, read, and erase data.

Moreover, the control instructions of the memory management circuit 202 may also be implemented in a hardware form according to another exemplary embodiment of the invention. For instance, the memory management circuit 202 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are electrically to the microcontroller. The memory cell management circuit is configured to manage physical erasing units of the rewritable non-volatile memory module 106. The memory writing circuit is configured to issue a writing command to the rewritable non-volatile memory module 106 for writing data thereto. The memory reading circuit is configured to issue a read command to the rewritable non-volatile memory module 106 for reading data therefrom. The memory erasing circuit is configured to issue an erasing command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is electrically connected to the memory management circuit 202 and configured to receive and identify commands and data transmitted by the host system 1000. Namely, the commands and data from the host system 1000 are transmitted to the memory management circuit 202 through the host interface 204. In the present exemplary embodiment, the host interface 204 complies with the SATA standard. However, the invention is not limited thereto, and the host interface 204 may also comply with the PATA standard, the IEEE 1394 standard, the PCI express standard, the USB standard, the UHS-I interface standard, the UHS-II interface standard, the MS standard, the MMC standard, the CF standard, the IDE standard, or any other appropriate data transmission standard.

The memory interface 206 is electrically connected to the memory management circuit 202 and configured to access the rewritable non-volatile memory module 106. Namely, data to be written into the rewritable non-volatile memory module 106 may be converted by the memory interface 206 into a format acceptable to the rewritable non-volatile memory module 106.

In an exemplary embodiment, the memory control circuit unit 104 further includes a buffer memory 208, a power management circuit 210, and an error checking and correcting (ECC) circuit 212.

The buffer memory 208 is electrically connected to the memory management circuit 202 and configured to temporarily store data and commands received from the host system 1000 or data received from the rewritable non-volatile memory module 106.

The power management circuit 210 is electrically connected to the memory management circuit 202 and configured to control the power supply of the memory storage apparatus 100.

The ECC circuit 212 is electrically connected to the memory management circuit 202, and configured for executing an error checking and correcting procedure to ensure data accuracy. To be specific, when the memory management circuit 202 receives a writing command from the host system 1000, the ECC circuit 212 generates an ECC code for data corresponding to the writing command, and the memory management circuit 202 writes the data and the corresponding ECC code into the rewritable non-volatile memory module 106. Thereafter, when reading the data from the rewritable non-volatile memory module 106, the memory management circuit 202 simultaneously reads the ECC code corresponding to the data, and the ECC circuit 212 performs the ECC procedure on the read data according to the corresponding ECC code.

Figure 6:
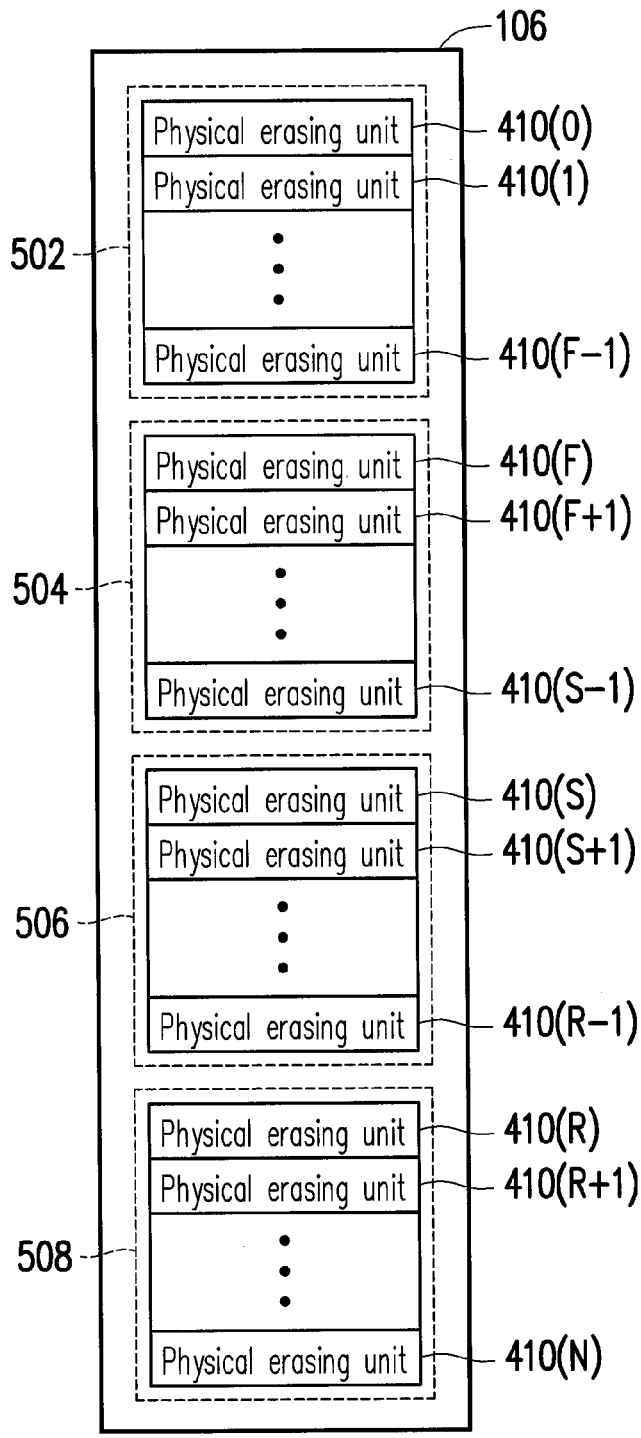
FIG. 6 and FIG. 7 are schematic diagrams illustrating an example of managing physical erasing units according to an exemplary embodiment of the present invention.
Figure 7:
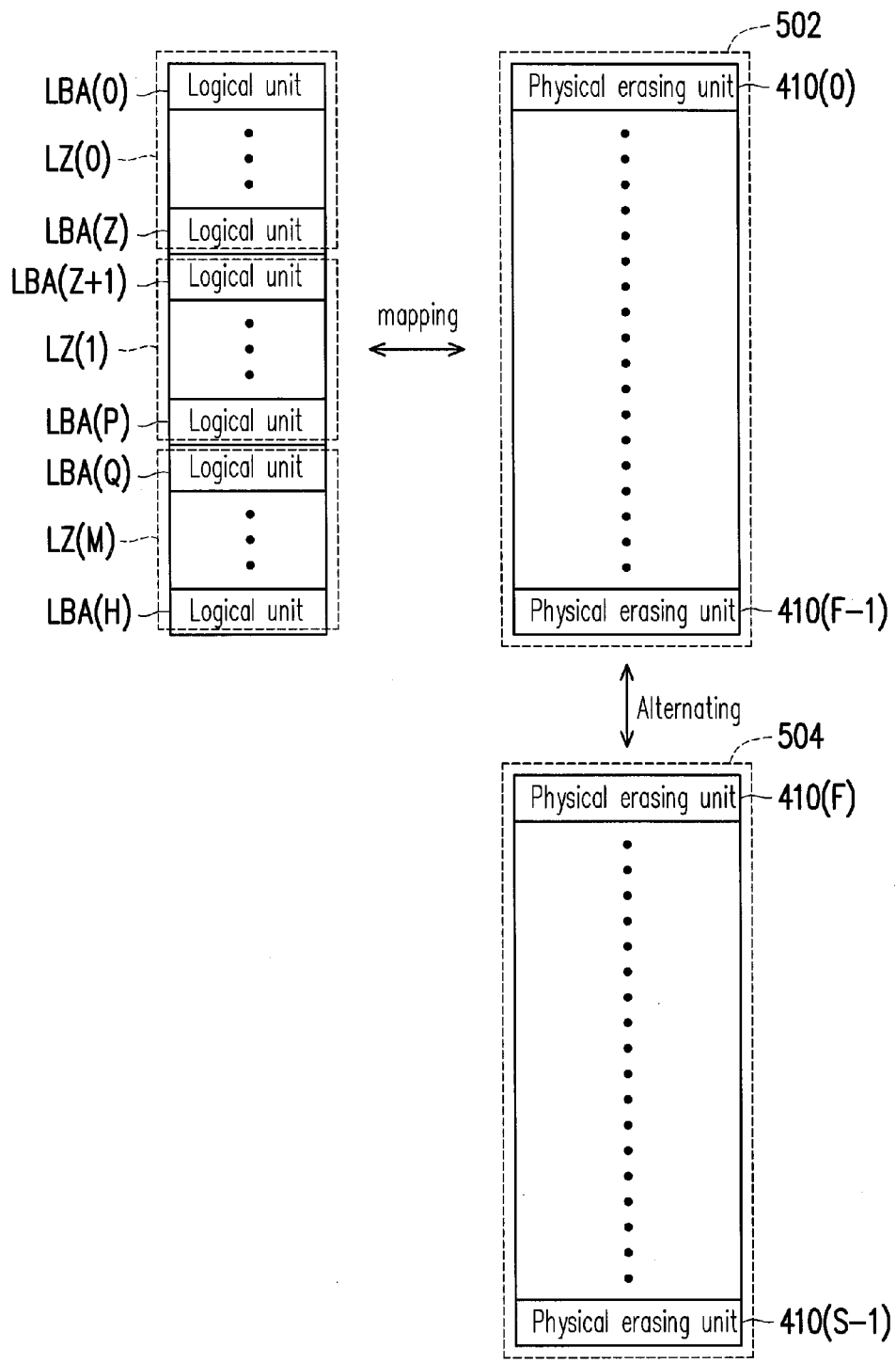

FIG. 6 and FIG. 7 are schematic diagrams illustrating an example of managing physical erasing units according to an exemplary embodiment of the invention.

With reference to FIG. 6, the memory control circuit unit 104 (or the memory management circuit 202) logically groups the physical erasing units 410(0) to 410(N) into a data area 502, a spare area 504, a system area 506, and a replacement area 508.

The physical erasing units logically belonging to the data area 502 and the spare area 504 are configured for storing data from the host system 1000. Particularly, the physical erasing units belonging to the data area 502 are already configured for storing data, and the physical erasing units belonging to the spare area 504 are configured for replacing the physical erasing units belonging to the data area 502. That is, when the writing commands and the data to be written are received from the host system 1000, the memory management circuit 202 gets physical erasing units from the spare area 504 and writes the data into the gotten physical erasing units for replacing the physical erasing units belonging to the data area 502.

The physical erasing units logically belonging to the system area 506 are used for recording system data. For instance, the system data include the manufacturers and models of the rewritable non-volatile memory module, the number of the physical erasing units in the rewritable non-volatile memory module, the number of the physical programming units in each physical erasing unit, and so on.

The physical erasing units logically belonging to the replacement area 508 are physical erasing units that are applied in a defective physical erasing unit replacement procedure to replace damaged and defective physical erasing units. Particularly, if there are still normal physical erasing units in the replacement area 508, and the physical erasing unit in the data area 502 is damaged, the memory management circuit 202 selects a normal physical erasing unit from the replacement area 508 to replace the defective physical erasing unit.

Note that the number of physical erasing units respectively belonging to the data area 502, the spare area 504, the system area 506, and the replacement area 508 may vary according to different memory specifications. Additionally, it has to be understood that the grouping relation of associating the physical erasing units with the data area 502, the spare area 504, the system area 506, and the replacement area 508 is dynamically changed during the operation of the memory storage apparatus 100. For instance, when a physical erasing unit belonging to the spare area 504 is damaged and replaced by a physical erasing unit belonging to the replacement area 508, the physical erasing unit originally belonging to the replacement area 508 is associated with the spare area 504.

As indicated in FIG. 7, the memory control circuit unit 104 (or the memory management circuit 202) has logical units LBA(0) to LBA(H) to be mapped to the physical erasing units belonging to the data area 502. Each of the logical units has a plurality of logical sub-units to be mapped to the physical programming units corresponding to the physical erasing units. Besides, if the host system 100 intends to write data into the logical units or update data stored in the logical units, the memory control circuit unit 104 (or the memory management circuit 202) selects one physical erasing unit from the spare area 504 to alternate with one physical erasing unit in the data area 502. In the present exemplary embodiment, the logical sub-units may be logical pages or logical factors.

In order to identify the actual physical erasing unit where data of each logical unit are stored, the memory control circuit unit 104 (or the memory management circuit 202) records mapping relations between the logical unit and the physical erasing unit according to the present exemplary embodiment. In addition, when the host system 1000 intends to access data in one of the logical sub-units, the memory control circuit unit 104 (or the memory management circuit 202) confirms the logical unit where the logical sub-unit belongs and issues a corresponding command sequence to the rewritable non-volatile memory module 106 to access data in the physical erasing unit mapped to said logical unit. For instance, in the present exemplary embodiment, the memory control circuit unit 104 (or the memory management circuit 202) stores a logical-to-physical address mapping table in the rewritable non-volatile memory module 106 for recording the physical erasing units respectively mapped to each logical unit. When accessing data, the memory control circuit unit 104 (or the memory management circuit 202) loads the logical-to-physical address mapping table to the buffer memory 208 for data maintenance.

It should be mentioned that the buffer memory 208 may not be able to store the mapping tables recording the mapping relations of all logical units due to its limited capacity. Therefore, in the present exemplary embodiment, the memory control circuit unit 104 (or the memory management circuit 202) groups the logical units LBA(0) to LBA(H) into a plurality of logical zones LZ(0) to LZ(M) and allocates one logical-to-physical address mapping table to each logical zone. Particularly, when the memory control circuit unit 104 (or the memory management circuit 202) updates the mapping relation of one of the logical units, the logical-to-physical address mapping table corresponding to the logical zone of the logical unit is loaded to the buffer memory 208 for being updated.

As mentioned above, in the present exemplary embodiment, the rewritable non-volatile memory module 106 of the memory storage apparatus 100 performs management by means of the physical programming units; therefore, when the writing command is executed, the memory control circuit unit 104 (or the memory management circuit 202) writes data into the physical programming units one after another no matter which logical sub-unit of the logical unit where data are to be written. Particularly, the memory control circuit unit 104 (or the memory management circuit 202) selects a blank physical erasing unit from the spare area 504 as the currently used physical erasing unit to write data. Once the currently used physical erasing unit is fully written with data, the memory control circuit unit 104 (or the memory management circuit 202) further selects another blank physical erasing unit from the spare area 504 as the currently used physical erasing unit to continuously write data corresponding to the writing command from the host system 1000. In order to prevent exhaustion of the physical erasing units in the spare area 504, when the memory control circuit unit 104 (or the memory management circuit 202) intends to select the physical erasing units from the spare area 504, and the number of the physical erasing units in the spare area 504 is reduced to the predetermined garbage collecting threshold, the memory control circuit unit 104 (or the memory management circuit 202) performs the data merging process to invalidate the data in at least one of the physical erasing units in the data area 502 and associates the physical erasing units that store the invalid data with the spare area 502, such that the number of the physical erasing units in the spare area 504 is greater than the predetermined garbage collecting threshold. For instance, while performing the data merging process, the memory control circuit unit 104 (or the memory management circuit 202) is required to use at least one blank physical erasing unit, and thus the predetermined garbage collecting threshold is at least greater than one.

Figure 8:
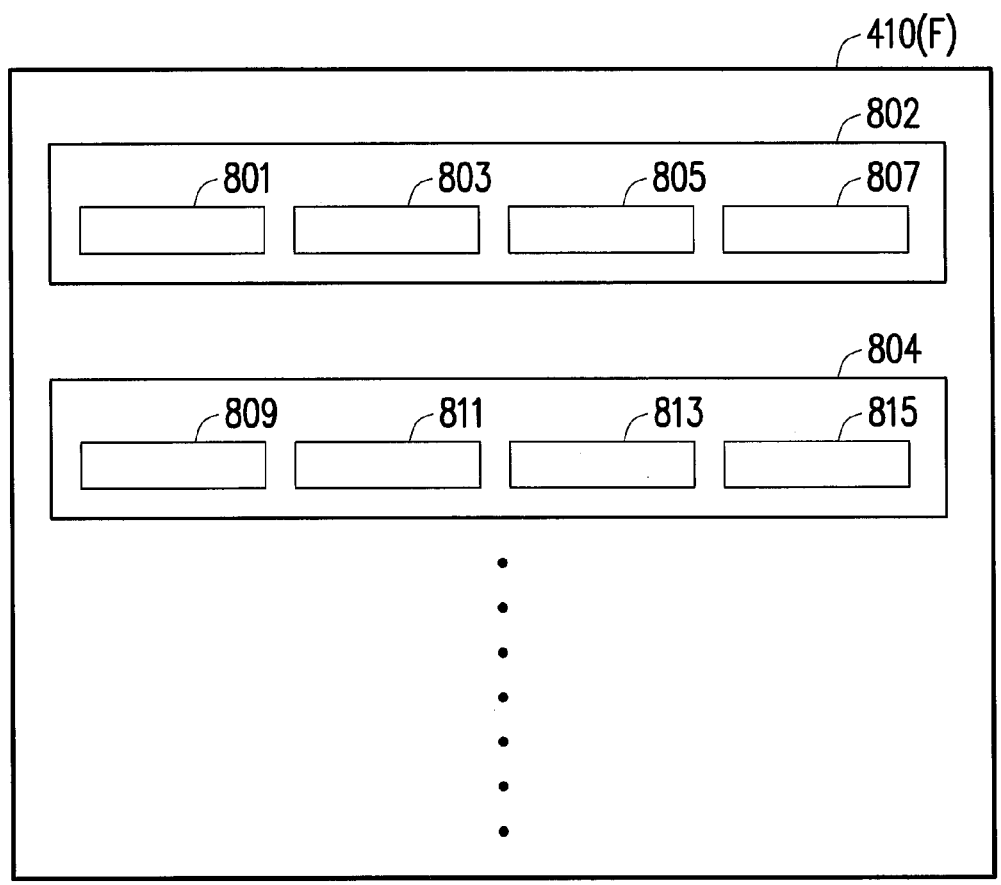
FIG. 8 is a schematic diagram illustrating an example of an error checking and correcting (ECC) frame according to an exemplary embodiment of the present invention.

FIG. 8 is a schematic diagram illustrating an example of an error checking and correcting (ECC) frame according to an exemplary embodiment of the present invention.

As mentioned above, the ECC circuit 212 in the memory storage apparatus 100 is configured to verify whether the data stored in the rewritable non-volatile memory module 106 are correct. However, during the ECC process, no matter the encoding step or the decoding step is performed, the ECC circuit 212 is required to learn the length of the data to be protected, so as to calculate the correct eigenvalue code and find out correctly the error location. In the present exemplary embodiment, when the memory control circuit unit 104 (or the memory management circuit 202) receives data, the memory control circuit unit 104 (or the memory management circuit 202) divides the data into a plurality of frames, and the ECC circuit 212 generates ECC codes corresponding to the frames, respectively, such that the frames and the ECC codes corresponding the frames are respectively encoded to form ECC frames. Here, the size of the ECC frame is determined by the size of the transmission unit, and the size of the transmission unit is determined according to the specification of the rewritable non-volatile memory module 106. Namely, each transmission unit is required to protect a certain number of bits. For instance, if the size of the transmission unit is 512 bytes and the number of the to-be-protected bits is 12 in each transmission unit, the memory control circuit unit 104 (or the memory management circuit 202) divides data into a plurality of frames each being 512 bytes. The ECC circuit 212 generates ECC codes for the frames each being 512 bytes. Accordingly, the size of each ECC frame is 512 bytes; however, the invention is not limited thereto, and each ECC frame may be 1K bytes, 2K bytes, and so forth. It should be mentioned that the size of each physical programming unit is at least greater than the size of one ECC frame, such that the data stored in the physical programming unit may, in the unit of the size of the ECC frame, be protected by the ECC circuit 212.

With reference to FIG. 8, according to the present exemplary embodiment, the capacity of the first physical programming unit 802 in the first physical erasing unit 410(F) stored in the spare area 504 is 2K bytes (2048 bytes), and the first physical programming unit 802 is capable of storing data whose size is equal to four ECC frames, i.e., the first ECC frame 801, the second ECC frame 803, the third ECC frame 805, and the fourth ECC frame 807. The size of each of the ECC frames 801, 803, 805, and 807 is 512 bytes.

During the operation of the rewritable non-volatile memory module 106, the memory control circuit unit 104 (or the memory management circuit 202) continuously records the number of bit errors in each ECC frame and applies the number of maximum bit errors as the number of maximum bit errors of the first physical programming unit 802. For instance, if the number of bit errors of the first ECC frame 801 is 3, the number of bit errors of the second ECC frame 803 is 4, the number of bit errors of the third ECC frame 805 is 5, and the number of bit errors of the fourth ECC frame 807 is 11, the number of maximum bit errors of the first physical programming unit 802 is 11. According to the above, the number of maximum bit errors of the second physical programming unit 804 can also be obtained and recorded during the operation of the rewritable non-volatile memory module 106. The memory control circuit unit 104 (or the memory management circuit 202) compares the number of maximum bit errors of each physical programming unit in the first physical erasing unit 410(F) and applies the greatest as the number of maximum bit errors of the first physical erasing unit 410(F). For instance, if the greatest of the number of bit errors among the number of maximum bit errors of the physical programming units in the first physical erasing unit 410(F) is 11, the number of maximum bit errors of the first physical erasing unit 410(F) is 11.

In the present exemplary embodiment, the memory control circuit unit 104 (or the memory management circuit 202) records the number of maximum bit errors of the first physical erasing unit 410(F). For instance, the memory control circuit unit 104 (or the memory management circuit 202) records the number of maximum bit errors of the first physical erasing unit 410(F) in a maximum bit error table and stores the maximum bit error table into the buffer memory 208. In addition, during the operation of the rewritable non-volatile memory module, the number of maximum bit errors of each physical erasing unit is continuously recorded, and the maximum bit error table is continuously updated. Besides, the newly recorded number of maximum bit errors of each physical erasing unit is compared with the number of maximum bit errors of each physical erasing unit recorded in the maximum bit error table; if the newly recorded number of maximum bit errors of each physical erasing unit is greater than the maximum the number of bit errors of each physical erasing unit recorded in the maximum bit error table, the maximum bit error table is updated. For instance, the number of maximum bit errors of the first physical erasing unit 410(F) recorded in the maximum bit error table is 11; during the operation of the rewritable non-volatile memory module, if the newly recorded number of maximum bit errors of the first physical erasing unit 410(F) is 12, the memory control circuit unit 104 (or the memory management circuit 202) compares the newly recorded number of maximum bit errors (i.e., 12) of the first physical erasing unit 410(F) with the number of maximum bit errors (i.e., 11) of the first physical erasing unit 410(F) recorded in the maximum bit error table and updates the maximum bit error table with the greater number of maximum bit errors, i.e., the number of maximum bit errors of the first physical erasing unit 410(F) recorded in the maximum bit error table is updated to 12.

According to the present exemplary embodiment, the maximum protection capacity of the ECC circuit 212 is 12 bits; therefore, if the number of bit errors in the ECC frame is greater than 12 (e.g., 13), the ECC circuit 212 is no longer able to correct the erroneous data in the ECC frame, such that the data stored in the ECC frame cannot be read and become damaged data that cannot be recovered. Said condition also means that the physical erasing unit having the damaged data is overly aged and can no longer be used. At this time, the memory control circuit unit 104 (or the memory management circuit 202) marks the physical programming unit whose number of bit errors exceeds the maximum protection capacity of the ECC circuit 212 as the defective physical programming unit and records the same into a defective physical programming unit allocation table.

In another exemplary embodiment, the memory control circuit unit 104 (or the memory management circuit 202) groups the physical erasing units in the spare area according to the number of maximum bit errors of each of these physical erasing units. For instance, the maximum protection capacity of the ECC circuit 212 is 12 bits; after the memory control circuit unit 104 (or the memory management circuit 202) records the number of maximum bit errors of each physical erasing unit in the spare area, the memory control circuit unit 104 (or the memory management circuit 202) categorizes the physical erasing units in the spare area into three groups, e.g., the physical erasing units with the number of bit errors from 0 to 4 are categorized into the first group, the physical erasing units with the number of bit errors from 5 to 9 are categorized into the second group, and the physical erasing units with the number of bit errors from 10 to 12 are categorized into the third group.

After grouping, the memory control circuit unit 104 (or the memory management circuit 202) sorts the groups by the number of bit errors. Specifically, the group with the least number of bit errors is prioritized, i.e., the first group is arranged before the second group, and the second group is arranged before the third group, and the physical erasing units categorized into these groups are not further sorted. Once the memory control circuit unit 104 (or the memory management circuit 202) intends to select the physical erasing unit from the spare area, the memory control circuit unit 104 (or the memory management circuit 202) starts to select the physical erasing unit from the group arranged in the front. That is, in view of the above, the memory control circuit unit 104 (or the memory management circuit 202) starts to select the physical erasing unit from the first group.

To sum up, according to an exemplary embodiment, as long as the number of bit errors does not exceed the protection capacity of the ECC circuit 212, the physical erasing units in the rewritable non-volatile memory module can be further used no matter whether or not the erasing counts of the physical erasing units reach the limit guaranteed by manufacturers, and thereby the lifespan of the rewritable non-volatile memory module 106 can be prolonged.

Note that the ECC frames and the manner of grouping the physical erasing units by the number of maximum bit errors provided in the embodiments of the invention are merely descriptive and should not be construed as limitations to the present invention.

Several exemplary embodiments are provided hereinafter with reference to the drawings to elaborate the memory management method that is applied to prolong the lifespan of the rewritable non-volatile memory module 106 through determining the use rate by the number of bit errors.

First Exemplary Embodiment

Figure 9:
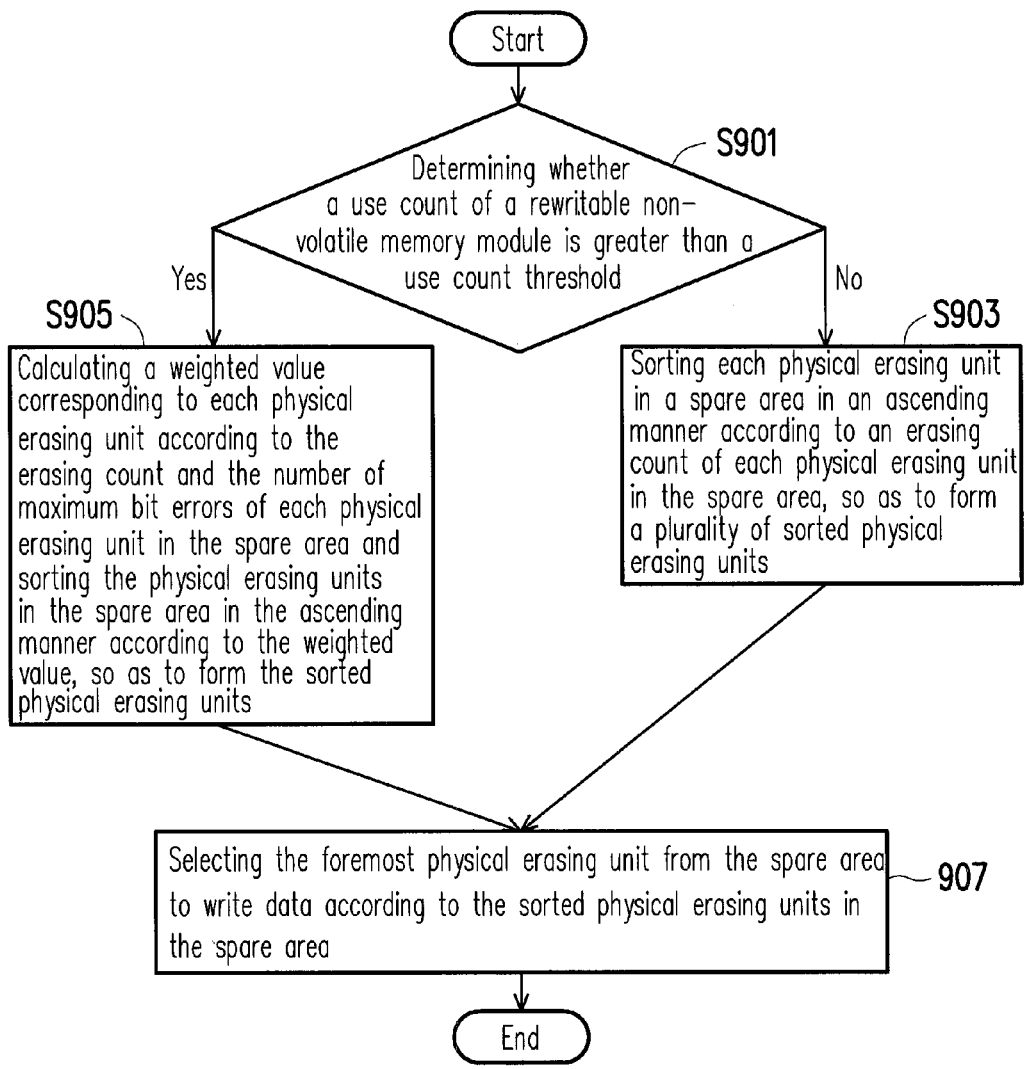
FIG. 9 is a flow chart illustrating a memory management method according to an exemplary embodiment of the present invention.

FIG. 9 is a flow chart illustrating a memory management method for prolonging the lifespan of the rewritable non-volatile memory module by using the use count of the rewritable non-volatile memory module according to an exemplary embodiment of the present invention.

With reference to FIG. 9, in step S901, the memory control circuit unit 104 (or the memory management circuit 202) determines whether a use count of the rewritable non-volatile memory module is greater than a use count threshold. In the present exemplary embodiment, the use count of the rewritable non-volatile memory module and the use count threshold may be determined during manufacture or after manufacture by firmware or software, and the invention is not limited thereto. For instance, the use count of the rewritable non-volatile memory module may be determined by the amount of data written into the rewritable non-volatile memory module. The memory control circuit unit 104 (or the memory management circuit 202) may start to record the amount of data written into the rewritable non-volatile memory module right after the rewritable non-volatile memory module is manufactured. No matter the data are copied, moved, or merged, these actions are recorded during the programming process, i.e., the amount of data written into the rewritable non-volatile memory module is recorded as long as the programming process is performed. Once the amount of data written into the rewritable non-volatile memory module reaches a predetermined value, the memory control circuit unit 104 (or the memory management circuit 202) determines that the use count of the rewritable non-volatile memory module reaches the use count threshold.

If the use count of the rewritable non-volatile memory module is not greater than the use count threshold, in step S903, each of the physical erasing units in the spare area is sorted in an ascending manner according to the erasing count of each of the physical erasing units in the spare area, so as to form a plurality of sorted physical erasing units. For instance, in order to elaborate the memory management method, the limited erasing count guaranteed by the manufacturer is assumed to be 3000, and only three physical erasing units are assumed to be in the spare area 504 of the rewritable non-volatile memory module, i.e., the first physical erasing unit 410(F) whose erasing count is 300, the second physical erasing unit 410(F+1) whose erasing count is 200, and the third physical erasing unit 410(F+2) whose erasing count is 100; at this time, the memory control circuit unit 104 (or the memory management circuit 202) sorts these three physical erasing units in an ascending manner according to the erasing count of each of these three physical erasing units, so as to form the sorted three physical erasing units, i.e., the third physical erasing unit 410(F+2), the second physical erasing unit 410 (F+1), and the first physical erasing unit 410(F), from front to back. Note that the condition "according to the erasing count" provided above includes the condition of sorting the three physical erasing units based on calculations made by means of the erasing count of each of the physical erasing units, so as to form the sorted three physical erasing units. For instance, the three physical erasing units may be sorted according to an erasing count weighted value of each of the physical erasing units, and the erasing count weighted value may be obtained by multiplying the erasing count of each of the three physical erasing units by a third predetermined value; however, this should not be construed as a limitation to the present invention.

After the step S903 is performed to form the sorted physical erasing units, in step S907, the memory control circuit unit 104 (or the memory management circuit 202) issues a command sequence to the rewritable non-volatile memory module 106 according to the sorted three physical erasing units, so as to select the foremost physical erasing unit and write data into the selected physical erasing unit. For instance, the third physical erasing unit 410 (F+2) is selected for writing data, and the flow is terminated.

If the use count of the rewritable non-volatile memory module is greater than the use count threshold, the memory control circuit unit 104 (or the memory management circuit 202) in step S905 calculates a weighted value corresponding to each of the physical erasing units according to the erasing count and the number of maximum bit errors of each of the physical erasing units in the spare area and sorts the physical erasing units in the spare area in the ascending manner according to the weighted value, so as to form the sorted physical erasing units.

For instance, in an exemplary embodiment, the memory control circuit unit 104 (or the memory management circuit 202) generates an erasing count weighted value by multiplying the erasing count of each of the physical erasing units in the spare area by a first predetermined value, generates a weighted value of the number of maximum bit errors by multiplying the number of maximum bit errors of each of the physical erasing units by a second predetermined value, and adds each of the erasing count weighted values and each of the weighted values of the number of maximum bit errors and applies the added values as the weighted values corresponding to the physical erasing units in the spare area.

For instance, in order to elaborate the memory management method, the limited erasing count guaranteed by the manufacturer is assumed to be 3000, the protection capacity of the ECC circuit 212 is 12 bits, the first predetermined value is 1, the second predetermined value is 100, and only three physical erasing units are assumed to be in the spare area 504 of the rewritable non-volatile memory module, i.e., the first physical erasing unit 410(F) whose erasing count is 3001, the second physical erasing unit 410(F+1) whose erasing count is 3010, and the third physical erasing unit 410(F+2) whose erasing count is 3100; besides, the number of maximum bit errors recorded by the first physical erasing unit 410(F) is 11, the number of maximum bit errors recorded by the second physical erasing unit 410(F+1) is 10, and the number of maximum bit errors recorded by the third physical erasing unit 410(F+2) is 9. Hence, the erasing count weighted value of the first physical erasing unit 410(F) is 3001 (i.e., multiplying 3001 by 1), the erasing count weighted value of the second physical erasing unit 410(F+1) is 3010 (i.e., multiplying 3010 by 1), and the erasing count weighted value of the third physical erasing unit 410(F+2) is 3100 (i.e., multiplying 3100 by 1). Moreover, the weighted value of the number of maximum bit errors of the first physical erasing unit 410(F) is 1100 (i.e., multiplying 11 by 100), the weighted value of the number of maximum bit errors of the second physical erasing unit 410(F+1) is 1000 (i.e., multiplying 10 by 100), and the weighted value of the number of maximum bit errors of the third physical erasing unit 410(F+2) is 900 (i.e., multiplying 9 by 100). After the erasing count weighted values and the weighted value of the number of maximum bit errors of all physical erasing units in the spare area are calculated, the memory control circuit unit 104 (or the memory management circuit 202) adds the erasing count weighted values and the weighted value of the number of maximum bit errors of all the physical erasing units in the spare area 504, so as to obtain the weighted values of the physical erasing units. That is, the weighted value of the first physical erasing unit 410(F) is 4101 (i.e., adding 3001 and 1100), the weighted value of the second physical erasing unit 410(F+1) is 4010 (i.e., adding 3010 and 1000), and the weighted value of the third physical erasing unit 410(F+2) is 4000 (i.e., adding 3100 and 900). The memory control circuit unit 104 (or the memory management circuit 202) then sorts these three physical erasing units in an ascending manner according to the weighted values, so as to form the sorted three physical erasing units, i.e., the third physical erasing unit 410(F+2), the second physical erasing unit 410(F+1), and the first physical erasing unit 410(F), from front to back. If the first predetermined value is set as 0, the weighted values merely include the weighted value of the number of maximum bit errors, i.e., the three physical erasing units are sorted in the ascending manner merely according to the weighted value of the number of maximum bit errors; if the second predetermined value is set as 0, the weighted values merely include the erasing count weighted values, i.e., the three physical erasing units are sorted in the ascending manner merely according to the erasing count weighted values.

After the step S905 is performed to form the sorted physical erasing units, in step S907, the memory control circuit unit 104 (or the memory management circuit 202) selects the foremost physical erasing unit from the sorted three physical erasing units in the spare area and writes data into the selected physical erasing unit. For instance, the third physical erasing unit 410 (F+2) is selected for writing data, and the step of extending the service life of the rewritable non-volatile memory module according to the average erasing count of the physical erasing units in the spare area is ended.

It should be mentioned that the method of calculating the weighted values is exemplified in the present exemplary embodiment to explain the present invention, while the present invention is not limited thereto.

Second Exemplary Embodiment

Steps provided in the second exemplary embodiment are similar to those provided in the first exemplary embodiment, while the difference therebetween lies in that whether the use count of the rewritable non-volatile memory module is greater than the use count threshold is determined according to the average erasing count of the rewritable non-volatile memory module in the second exemplary embodiment. The difference will be elaborated hereinafter.

Figure 10:
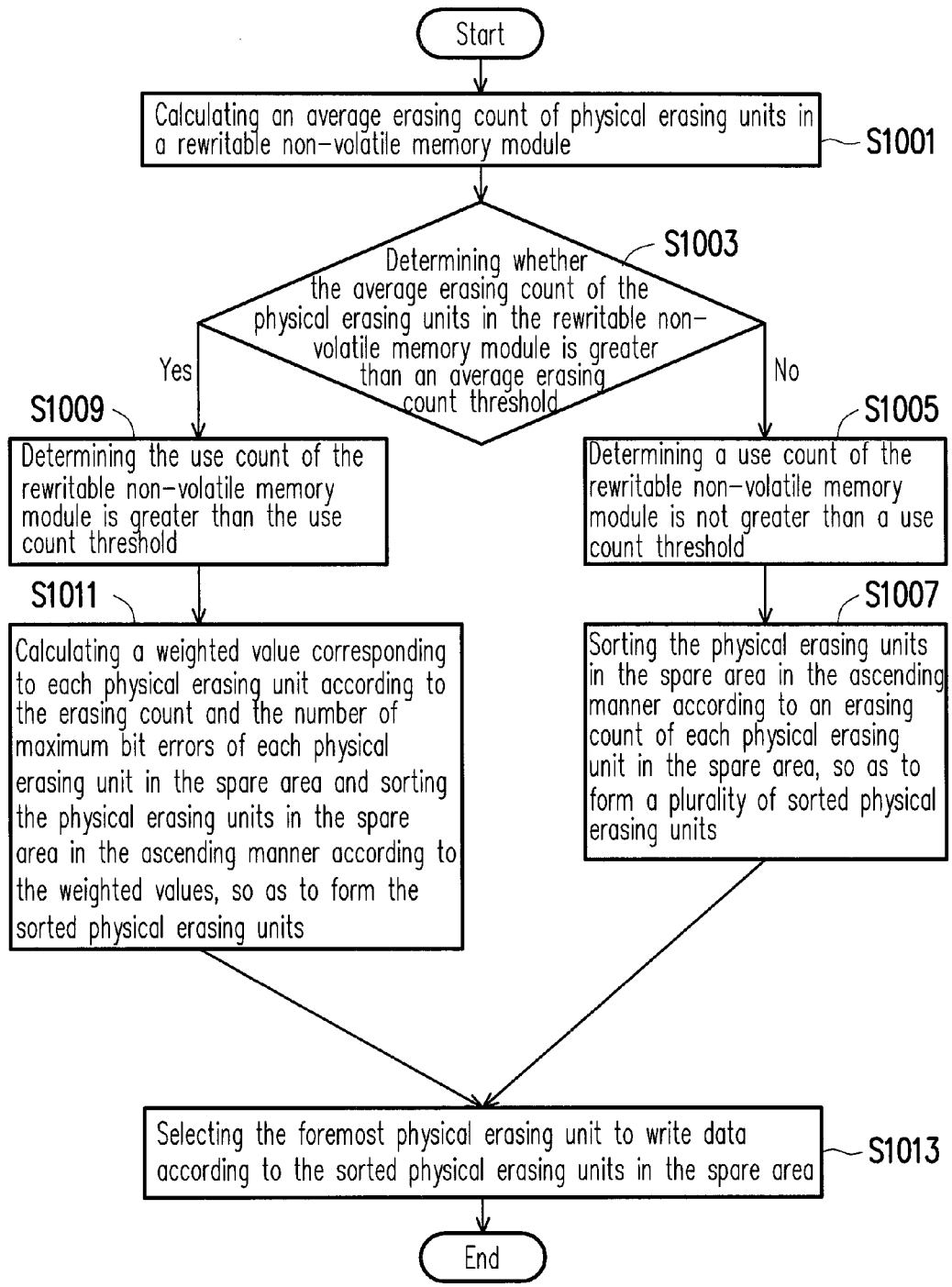
FIG. 10 is a flow chart illustrating a memory management method according to an exemplary embodiment of the present invention.

FIG. 10 is a flow chart illustrating a memory management method for prolonging the lifespan of the rewritable non-volatile memory module by using the average erasing count of the physical erasing units in the rewritable non-volatile memory module according to an exemplary embodiment of the present invention.

With reference to FIG. 10, in step S1001, the memory control circuit unit 104 (or the memory management circuit 202) calculates an average erasing count of the physical erasing units in the rewritable non-volatile memory module 106.

In step S1003, the memory control circuit unit 104 (or the memory management circuit 202) determines whether the average erasing count of the physical erasing units in the rewritable non-volatile memory module 106 is greater than an average erasing count threshold. In the present exemplary embodiment, the average erasing count threshold may be determined during manufacture or after manufacture by firmware or software, and the invention is not limited thereto.

If the average erasing count of the physical erasing units in the rewritable non-volatile memory module 106 is not greater than the average erasing count threshold, the memory control circuit unit 104 (or the memory management circuit 202) in step S1005 determines the use count of the rewritable non-volatile memory module 106 is not greater than the use count threshold and in step S1007 sorts the physical erasing units in the spare area in the ascending manner according to the erasing count of each of the physical erasing units in the spare area, so as to form the sorted physical erasing units. The sorting method is the same as that described in the first exemplary embodiment and thus will not be further explained hereinafter.

After the step S1007 is performed to form the sorted physical erasing units, in step S1013, the memory control circuit unit 104 (or the memory management circuit 202) selects the foremost physical erasing unit from the sorted three physical erasing units and writes data into the selected physical erasing unit. The selecting method is the same as that described in the first exemplary embodiment and thus will not be further explained hereinafter.

If the average erasing count of the physical erasing units in the rewritable non-volatile memory module 106 is greater than the average threshold erasing count, the memory control circuit unit 104 (or the memory management circuit 202) in step S1009 determines that the use count of the rewritable non-volatile memory module is greater than the use count threshold and in step S1011 calculates the weighted value corresponding to each physical erasing unit according to the erasing count and the number of maximum bit errors of each physical erasing unit in the spare area and sorts the physical erasing units in the spare area in the ascending manner according to the weighted values, so as to form the sorted physical erasing units.

The method of calculating the weighted value corresponding to each physical erasing unit according to the erasing count and the number of maximum bit errors of each physical erasing unit in the spare area is the same as that described in the first exemplary embodiment and thus will not be further explained hereinafter.

After the step S1011 is performed to form the sorted physical erasing units, in step S1013, the memory control circuit unit 104 (or the memory management circuit 202) selects the foremost physical erasing unit from the sorted three physical erasing units in the spare area and writes data into the selected physical erasing unit. The selecting method is the same as that described in the first exemplary embodiment and thus will not be further explained hereinafter.

It should be mentioned that the memory control circuit unit 104 (or the memory management circuit 202) provided in the present exemplary embodiment determines whether the use count of the rewritable non-volatile memory module is greater than the use count threshold by calculating the average erasing count of all the physical erasing units in the rewritable non-volatile memory module 106. Nevertheless, the present invention is not limited thereto. According to another exemplary embodiment, the memory control circuit unit 104 (or the memory management circuit 202) determines whether the use count of the rewritable non-volatile memory module is greater than the use count threshold by calculating the average erasing count of some of the physical erasing units in the rewritable non-volatile memory module 106. For instance, the memory control circuit unit 104 (or the memory management circuit 202) determines whether the use count of the rewritable non-volatile memory module is greater than the use count threshold according to the average erasing count of the physical erasing units in the spare area 504.

Third Exemplary Embodiment

Steps provided in the third exemplary embodiment are similar to those provided in the second exemplary embodiment, while the difference therebetween lies in that whether the use count of the rewritable non-volatile memory module is greater than the use count threshold is determined according to the erasing count of the individual physical erasing unit in the third exemplary embodiment. The difference will be elaborated hereinafter.

Figure 11:
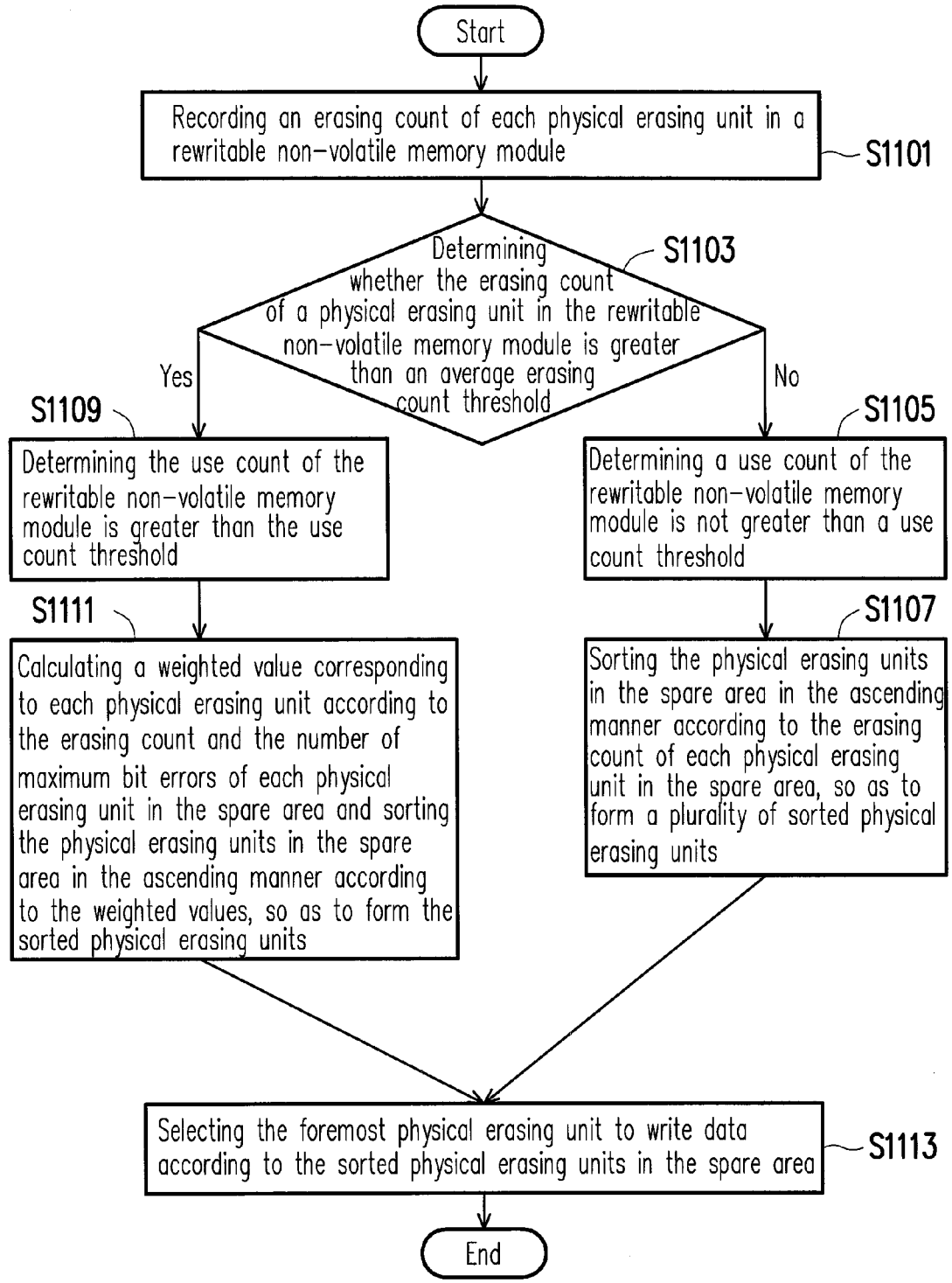
FIG. 11 is a flow chart illustrating a memory management method according to an exemplary embodiment of the present invention.

FIG. 11 is a flow chart illustrating a memory management method for prolonging the lifespan of the rewritable non-volatile memory module 106 by using the erasing count of each physical erasing unit in the spare area according to an exemplary embodiment of the present invention.

With reference to FIG. 11, in step S1101, the memory control circuit unit 104 (or the memory management circuit 202) records the erasing count of each physical erasing unit in the rewritable non-volatile memory module 106.

In step S1103, the memory control circuit unit 104 (or the memory management circuit 202) determines whether the erasing count of any of the physical erasing units in the rewritable non-volatile memory module 106 is greater than an average erasing count threshold. In the present exemplary embodiment, the average erasing count threshold may be determined during manufacture or after manufacture by firmware or software, and the invention is not limited thereto.

If the erasing counts of all the physical erasing units in the rewritable non-volatile memory module 106 are not greater than the average erasing count threshold, the memory control circuit unit 104 (or the memory management circuit 202) in step S1105 determines the use count of the rewritable non-volatile memory module is not greater than the use count threshold and in step S1107 sorts the physical erasing units in the spare area in the ascending manner according to the erasing count of each of the physical erasing units in the spare area, so as to form the sorted physical erasing units. The sorting method is the same as that described in the first exemplary embodiment and thus will not be further explained hereinafter.

After the step S1107 is performed to form the sorted physical erasing units, in step S1113, the memory control circuit unit 104 (or the memory management circuit 202) selects the foremost physical erasing unit from the sorted three physical erasing units and writes data into the selected physical erasing unit. The selecting method is the same as that described in the first exemplary embodiment and thus will not be further explained hereinafter.

If the average erasing count of any of the physical erasing units in the rewritable non-volatile memory module 106 is greater than the average erasing count threshold, the memory control circuit unit 104 (or the memory management circuit 202) in step S1109 determines that the use count of the rewritable non-volatile memory module is greater than the use count threshold and in step S1111 calculates the weighted value corresponding to each physical erasing unit according to the erasing count and the number of maximum bit errors of each physical erasing unit in the spare area and sorts the physical erasing units in the spare area in the ascending manner according to the weighted values, so as to form the sorted physical erasing units.

The method of calculating the weighted value corresponding to each physical erasing unit according to the erasing count and the number of maximum bit errors of each physical erasing unit in the spare area is the same as that described in the first exemplary embodiment and thus will not be further explained hereinafter.

After the step S1111 is performed to form the sorted physical erasing units, in step S1113, the memory control circuit unit 104 (or the memory management circuit 202) selects the foremost physical erasing unit from the sorted three physical erasing units in the spare area and writes data into the selected physical erasing unit. The selecting method is the same as that described in the first exemplary embodiment and thus will not be further explained hereinafter.

In sum, according to the memory management method, the memory control circuit unit, and the memory storage apparatus described herein, even though the use counts of some physical erasing units in the rewritable non-volatile memory module reach the limit guaranteed by the manufacturers, these physical erasing units can continuously be used and will not be marked as the defective physical erasing units only because the use counts of these physical erasing units exceed the limit. Besides, the order of using the physical erasing units is determined according to the number of bit errors of each physical erasing unit. That is, after the erasing counts of the physical erasing units exceed the average erasing count threshold, the physical erasing units can still be used if the number of the bit errors in these physical erasing units is still within the protection capacity of the ECC circuit. Moreover, the frequency of using each physical erasing unit can be changed according to the degree of bit errors in each physical erasing unit, such that less priority is given to the sorted physical erasing units with more bit errors in the spare area (i.e., the frequency of using the physical erasing units with more bit errors is decreased), and that the physical erasing units with less bit errors in the spare area are prioritized (i.e., the frequency of using the physical erasing units with less bit errors is increased). Accordingly, the aging of the physical erasing units is balanced, and the lifespan of the rewritable non-volatile memory module may be prolonged.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory management method for a rewritable non-volatile memory module, wherein the rewritable non-volatile memory module having a plurality of physical erasing units, the memory management method comprising:
    recording an erasing count of each of the physical erasing units;
    grouping the physical erasing units at least into a spare area and a data area;
    determining whether a use count of the rewritable non-volatile memory module is greater than a use count threshold;
    if the use count of the rewritable non-volatile memory module is not greater than the use count threshold, sorting each of the physical erasing units in the spare area in an ascending manner according to the erasing count of each of the physical erasing units in the spare area to form a plurality of sorted physical erasing units;
    if the use count of the rewritable non-volatile memory module is greater than the use count threshold, sorting each of the physical erasing units in the spare area in the ascending manner according to the number of maximum bit errors of the physical erasing units in the spare area to form the sorted physical erasing units; and
    selecting a first physical erasing unit from the spare area to write data according to the sorted physical erasing units, wherein the first physical erasing unit is a foremost physical erasing unit of the sorted physical erasing units.

2. The memory management method as recited in claim 1, wherein the step of determining whether the use count of the rewritable non-volatile memory module is greater than the use count threshold comprises:
    calculating an average erasing count of the physical erasing units according to the erasing count of each of the physical erasing units;
    determining whether the average erasing count of the physical erasing units is greater than a erasing count threshold;
    if the average erasing count of the physical erasing units is greater than the erasing count threshold, determining the use count of the rewritable non-volatile memory module is greater than the use count threshold; and
    if the average erasing count of the physical erasing units is not greater than the erasing count threshold, determining the use count of the rewritable non-volatile memory module is not greater than the use count threshold.

3. The memory management method as recited in claim 1, wherein the step of determining whether the use count of the rewritable non-volatile memory module is greater than the use count threshold comprises:
  determining whether the erasing count of at least one of the physical erasing units is greater than a erasing count threshold;
  if the erasing count of the at least one of the physical erasing units is greater than the erasing count threshold, determining the use count of the rewritable non-volatile memory module is greater than the use count threshold; and
  if the erasing count of each of the physical erasing units is not greater than the erasing count threshold, determining the use count of the rewritable non-volatile memory module is not greater than the use count threshold.

4. The memory management method as recited in claim 1, wherein each of the physical erasing units comprises a plurality of physical programming units, and each of the physical programming units stores at least one error checking and correcting frame, the memory management method comprising:
  continuously recording the number of bit errors in each of the at least one error checking and correcting frame in the first physical erasing unit among the physical erasing units; and
  applying the number of maximum bit errors as the number of maximum bit errors of the first physical erasing unit.

5. The memory management method as recited in claim 1, wherein the step of sorting each of the physical erasing units in the spare area in the ascending manner according to the erasing count of each of the physical erasing units in the spare area to form the sorted physical erasing units comprises:
  obtaining an erasing count weighted value by multiplying the erasing count of each of the physical erasing units in the spare area by a third predetermined value; and
  sorting each of the physical erasing units in the spare area in the ascending manner according to the erasing count weighted value to form the sorted physical erasing units.

6. The memory management method as recited in claim 1, wherein the step of sorting each of the physical erasing units in the spare area in the ascending manner according to the number of maximum bit errors of the physical erasing units in the spare area to form the sorted physical erasing units comprises:
  calculating a weighted value corresponding to each of the physical erasing units according to the erasing count and the number of maximum bit errors of each of the physical erasing units in the spare area and sorting the physical erasing units in the spare area in the ascending manner according to the weighted value to form the sorted physical erasing units.

7. The memory management method as recited in claim 6, wherein the step of calculating the weighted value corresponding to each of the physical erasing units according to the erasing count and the number of maximum bit errors of each of the physical erasing units in the spare area comprises:
  generating an erasing count weighted value corresponding to each of the physical erasing units by multiplying the erasing count of each of the physical erasing units by a first predetermined value;
  generating a weighted value of the number of maximum bit errors corresponding to each of the physical erasing units by multiplying the number of maximum bit errors of each of the physical erasing units by a second predetermined value; and
  adding each of the erasing count weighted values and each of the weighted values of the number of maximum bit errors and applying the added values as the weighted value corresponding to each of the physical erasing units.

8. A memory control circuit unit for controlling a rewritable non-volatile memory module, the memory control circuit unit comprising:
  a host interface configured to be coupled to a host system; and
  a memory interface configured to be coupled to the rewritable non-volatile memory module, wherein the rewritable non-volatile memory module has a plurality of physical erasing units; and
  a memory management circuit coupled to the host interface and the memory interface and configured to record an erasing count of each of the physical erasing units,
  wherein the memory management circuit is further configured to group the physical erasing units at least into a spare area and a data area,
  wherein the memory management circuit is further configured to determine whether a use count of the rewritable non-volatile memory module is greater than a use count threshold,
  if the use count of the rewritable non-volatile memory module is not greater than the use count threshold, the memory management circuit is further configured to sort each of the physical erasing units in the spare area in an ascending manner according to the erasing count of each of the physical erasing units in the spare area to form a plurality of sorted physical erasing units,
  and if the use count of the rewritable non-volatile memory module is greater than the use count threshold, the memory management circuit is further configured to sort each of the physical erasing units in the spare area in the ascending manner according to the number of maximum bit errors of the physical erasing units in the spare area to form the sorted physical erasing units,
  wherein the memory management circuit is further configured to issue a command sequence to the rewritable non-volatile memory module, the command sequence indicates selecting a first physical erasing unit from the spare area to write data according to the sorted physical erasing units, and the first physical erasing unit is a foremost physical erasing unit of the sorted physical erasing units.

9. The memory control circuit unit as recited in claim 8, wherein in the operation of determining whether the use count of the rewritable non-volatile memory module is greater than the use count threshold, the memory management circuit calculates an average erasing count of the physical erasing units according to the erasing count of each of the physical erasing units and determines whether the average erasing count of the physical erasing units is
  greater than a erasing count threshold,
  if the average erasing count of the physical erasing units is greater than the erasing count threshold, the memory management circuit determines the use count of the rewritable non-volatile memory module is greater than the use count threshold,
  and if the average erasing count of the physical erasing units is not greater than the erasing count threshold, the memory management circuit determines the use count of the rewritable non-volatile memory module is not greater than the use count threshold.

10. The memory control circuit unit as recited in claim 8, wherein in the operation of determining whether the use count of the rewritable non-volatile memory module is greater than the use count threshold, the memory management circuit determines whether the erasing count of at least one of the physical erasing units is greater than a erasing count threshold, if the erasing count of the at least one of the physical erasing units is greater than the erasing count threshold, the memory management circuit determines the use count of the rewritable non-volatile memory module is greater than the use count threshold, and if the erasing count of each of the physical erasing units is not greater than the erasing count threshold, the memory management circuit determines the use count of the rewritable non-volatile memory module is not greater than the use count threshold.

11. The memory control circuit unit as recited in claim 8, wherein each of the physical erasing units comprises a plurality of physical programming units, and each of the physical programming units stores at least one error checking and correcting frame, wherein the memory management circuit is further configured to continuously record the number of bit errors in each of the at least one error checking and correcting frame in the first physical erasing unit and apply the number of maximum bit errors as the number of maximum bit errors of the first physical erasing unit.

12. The memory control circuit unit as recited in claim 8, in the operation of sorting each of the physical erasing units in the spare area in the ascending manner according to the erasing count of each of the physical erasing units in the spare area to form the sorted physical erasing units, the memory management circuit obtains an erasing count weighted value by multiplying the erasing count of each of the physical erasing units in the spare area by a third predetermined value, and the memory management circuit sorts each of the physical erasing units in the spare area in the ascending manner according to the erasing count weighted value to form the sorted physical erasing units.

13. The memory control circuit unit as recited in claim 8, wherein in the operation of sorting each of the physical erasing units in the spare area in the ascending manner according to the number of maximum bit errors of the physical erasing units in the spare area to form the sorted physical erasing units, the memory management circuit calculates a weighted value corresponding to each of the physical erasing units according to the erasing count and the number of maximum bit errors of each of the physical erasing units in the spare area and sorts the physical erasing units in the spare area in the ascending manner according to the weighted value to form the sorted physical erasing units.

14. The memory control circuit unit as recited in claim 13, wherein in the operation of calculating the weighted value corresponding to each of the physical erasing units according to the erasing count and the number of maximum bit errors of each of the physical erasing units in the spare area, the memory management circuit generates an erasing count weighted value corresponding to each of the physical erasing units by multiplying the erasing count of each of the physical erasing units by a first predetermined value, generates a weighted value of the number of maximum bit errors corresponding to each of the physical erasing units by multiplying the number of maximum bit errors of each of the physical erasing units by a second predetermined value, and adds each of the erasing count weighted values and each of the weighted values of the number of maximum bit errors and applies the added values as the weighted value corresponding to each of the physical erasing units.

15. A memory storage apparatus comprising:

a connection interface unit configured to be coupled to a host system;

a rewritable non-volatile memory module having a plurality of physical erasing units; and a memory control circuit unit coupled to the connection interface unit and the rewritable non-volatile memory module and configured to record an erasing count of each of the physical erasing units, wherein the memory control circuit unit is further configured to group the physical erasing units at least into a spare area and a data area, wherein the memory control circuit unit is further configured to determine whether a use count of the rewritable non-volatile memory module is greater than a use count threshold, if the use count of the rewritable non-volatile memory module is not greater than the use count threshold, the memory control circuit unit is further configured to sort each of the physical erasing units in the spare area in an ascending manner according to the erasing count of each of the physical erasing units in the spare area to form a plurality of sorted physical erasing units, and if the use count of the rewritable non-volatile memory module is greater than the use count threshold, the memory control circuit unit is further configured to sort each of the physical erasing units in the spare area in the ascending manner according to the number of maximum bit errors of the physical erasing units in the spare area to form the sorted physical erasing units, wherein the memory control circuit unit is further configured to select a first physical erasing unit from the spare area to write data according to the sorted physical erasing units, and the first physical erasing unit is a foremost physical erasing unit of the sorted physical erasing units.

16. The memory storage apparatus as recited in claim 15, wherein in the operation of determining whether the use count of the rewritable non-volatile memory module is greater than the use count threshold, the memory control circuit unit calculates an average erasing count of the physical erasing units according to the erasing count of each of the physical erasing units and determines whether the average erasing count of the physical erasing units is greater than a erasing count threshold, if the average erasing count of the physical erasing units is greater than the erasing count threshold, the memory control circuit unit determines the use count of the rewritable non-volatile memory module is greater than the use count threshold, if the average erasing count of the physical erasing units is not greater than the erasing count threshold, the memory control circuit unit determines the use count of the rewritable non-volatile memory module is not greater than the use count threshold.

17. The memory storage apparatus as recited in claim 15, in the operation of determining whether the use count of the rewritable non-volatile memory module is greater than the use count threshold, the memory control circuit unit determines whether the erasing count of at least one of the physical erasing units is greater than a erasing count threshold, if the erasing count of the at least one of the physical erasing units is greater than the erasing count threshold, the memory control circuit unit determines the use count of the rewritable non-volatile memory module is greater than the use count threshold, if the erasing count of each of the physical erasing units is not greater than the erasing count threshold, the memory control circuit unit determines the use count of the rewritable non-volatile memory module is not greater than the use count threshold.

18. The memory storage apparatus as recited in claim 15, wherein each of the physical erasing units comprises a plurality of physical programming units, and each of the physical programming units stores at least one error checking and correcting frame, wherein the memory control circuit unit is further configured to continuously record an the number of bit errors in each of the at least one error checking and correcting frame in the first physical erasing unit and apply the number of maximum bit errors as the number of maximum bit errors of the first physical erasing unit.

19. The memory storage apparatus as recited in claim 15, wherein in the operation of sorting each of the physical erasing units in the spare area in the ascending manner according to the erasing count of each of the physical erasing units in the spare area to form the sorted physical erasing units, the memory control circuit unit obtains an erasing count weighted value by multiplying the erasing count of each of the physical erasing units in the spare area by a third predetermined value, and the memory control circuit unit sorts each of the physical erasing units in the spare area in the ascending manner according to the erasing count weighted value to form the sorted physical erasing units.

20. The memory storage apparatus as recited in claim 15, wherein in the operation of sorting each of the physical erasing units in the spare area in the ascending manner according to the number of maximum bit errors of the physical erasing units in the spare area to form the sorted physical erasing units, the memory control circuit unit calculates a weighted value corresponding to each of the physical erasing units according to the erasing count and the number of maximum bit errors of each of the physical erasing units in the spare area and sorts the physical erasing units in the spare area in the ascending manner according to the weighted value to form the sorted physical erasing units.

21. The memory storage apparatus as recited in claim 20, wherein in the operation of calculating the weighted value corresponding to each of the physical erasing units according to the erasing count and the number of maximum bit errors of each of the physical erasing units in the spare area, the memory control circuit unit generates an erasing count weighted value corresponding to each of the physical erasing units by multiplying the erasing count of each of the physical erasing units by a first predetermined value, generates a weighted value of the number of maximum bit errors corresponding to each of the physical erasing units by multiplying the number of maximum bit errors of each of the physical erasing units by a second predetermined value, and adds each of the erasing count weighted values and each of the weighted values of the number of maximum bit errors and applies the added values as the weighted value corresponding to each of the physical erasing units.

* * * * *